United States Patent [19]

Osborn

[11] 4,153,878
[45] May 8, 1979

[54] SECTORED ANTENNA COMMUNICATIONS RECEIVER WITH SQUELCH CIRCUIT

[75] Inventor: James L. Osborn, Arlington Heights, Ill.

[73] Assignee: Motorola, Inc., Schaumburg, Ill.

[21] Appl. No.: 792,943

[22] Filed: May 2, 1977

[51] Int. Cl.² .............................................. H04B 1/10
[52] U.S. Cl. ..................................... 325/370; 325/478
[58] Field of Search .............. 325/478, 348, 302, 304, 325/56, 366, 370, 402, 403

[56] References Cited

U.S. PATENT DOCUMENTS

| 3,206,679 | 9/1965 | Miller ................................... 325/304 |
| 3,979,679 | 9/1976 | Bush et al. ........................... 325/478 |
| 4,013,962 | 3/1977 | Beseke et al. ........................ 325/478 |

Primary Examiner—Robert L. Griffin
Assistant Examiner—Marc E. Bookbinder
Attorney, Agent, or Firm—James W. Gillman; Victor Myer

[57] ABSTRACT

A receiver produced signal includes an information signal immediately preceded and followed by noise signals. The presence of an information signal is sensed by detector circuitry which, after an inherent delay interval, closes a squelch gate. The detector experiences an additional delay at the conclusion of an information signal.

To prevent both deletion of the initial portion of the information signal and a noise "tail" following said signal, a delay line, comprised of a bucket brigade device, is series coupled between the receiver and the squelch gate. The delay provided by the delay line is approximately equal to the inherent delay time of the detector means.

5 Claims, 4 Drawing Figures

SECTORED ANTENNA COMMUNICATIONS RECEIVER WITH SQUELCH CIRCUIT

BACKGROUND OF THE INVENTION

The present invention pertains to the signal processing art and, more particularly, to an improved squelch detector.

Squelch circuits are well known, especially in the communications art. Communication receivers utilize squelch systems to mute the receiver audio during the absence of a received signal. Without a squelch circuit, the receiver would be continuously producing annoying random noise audio during the intermission between broadcast signals.

Most squelch systems employ a squelch detector, which is a time averaging circuit that opens the audio channel once a broadcast signal is detected. Since squelch detectors are basically integrating type systems, there is a distinct time lag from the time a broadcast signal is received for turn on of the audio channel and, similarly, a time lag following the received signal before the audio channel is muted.

As a result of the detector time lag at the instance of reception of a received signal the initial portion of the information signal may be lost, thus reducing intelligibility of the overall communication system. During the time lag following the termination of a broadcast signal, when the squelch detector maintains the audio channel open the receiver operator is subjected to the above mentioned annoying random noise.

Considerable effort has been spent by those in the communication art to minimize or eliminate the above described failings of conventional squelch systems. In one approach, special circuitry is provided within the transmitter to precede and succeed each information signal broadcast by either a predetermined period dead carrier time or a coded tone. Corresponding unique circuitry is provided in the receiver to delay and process the received signal such that the squelch opens the audio channel prior to the actual information message and closes the channel prior to the end of the total transmission. This approach, while possibly effective in eliminating the annoyance of delay in the squelch detector, is impractical in widespread operation. For example, practical implementation of the prior art system would require strict standardization of all transmitters and receivers such that they contain the appropriate encoding and decoding circuitry. This would necessarily result in a substantial increase of overall system cost.

SUMMARY OF THE INVENTION

It is an object of this invention, therefore, to provide a squelch circuit which is effective to minimize or eliminate loss of data at the beginning of an information signal and an annoying noise burst following termination of the information signal.

It is a further object of the invention to provide the above described squelch circuit in a form which is economical and convenient to implement and which does not require a specially encoded transmitted signal.

Briefly, according to the invention, the squelch circuit is adapted to receive and process an input signal which contains an information signal followed immediately by a noise signal. The squelch circuit includes a detector which detects the presence of an information signal on the input signal and produces a control signal in response thereto. The detector exhibits a predetermined delay time between the time of receiving an information signal and the time of production of the control signal. A provided gate has an input terminal, an output terminal and a control terminal. The gate responds to control signals received at its control input terminal to couple its input terminal to its output terminal. The detector produced control signal is coupled to the control input terminal of the gating means via suitable coupling. Delay circuitry couples the input signal to the gating means first terminal. The delay circuitry provides a fixed delay to the input signal, this fixed delay being approximately equal to the delay of the detector circuitry. Thus, in operation, the input signal is passed to the second terminal of the gate only for the duration of the information signal thereby minimizing or eliminating loss of information at the beginning of the information signal and the occurrence of a noise burst following the conclusion of the information signal.

BRIEF DESCRIPTION OF THE DRAWINGS

Referring to FIG. 1, radio signals picked up by an antenna 12 are passed to conventional receiver circuitry 14. The receiver 14 includes conventional circuitry to produce an audio signal at its output 14a. The audio output is in turn split into two parallel paths. One path includes squelch detector 16. Squelch detector 16 includes circuitry for determining the presence of an information signal on the input signal to the antenna 12. If an information signal is detected the squelch detector produces a control signal at its output 16a. The squelch detector 16 is of conventional design employing an integrating network to determine the presence of a high level information signal. Thus, it exhibits a predetermined time lag before it produces the control signal and there is a time lag following reception of an information signal before the control signal at the squelch detector output 16a is removed. Hence, if the squelch circuit only included the squelch detector 16 there would be loss of information at the beginning of the information signal and a resulting noise burst at the conclusion of an information signal.

Figure 1:
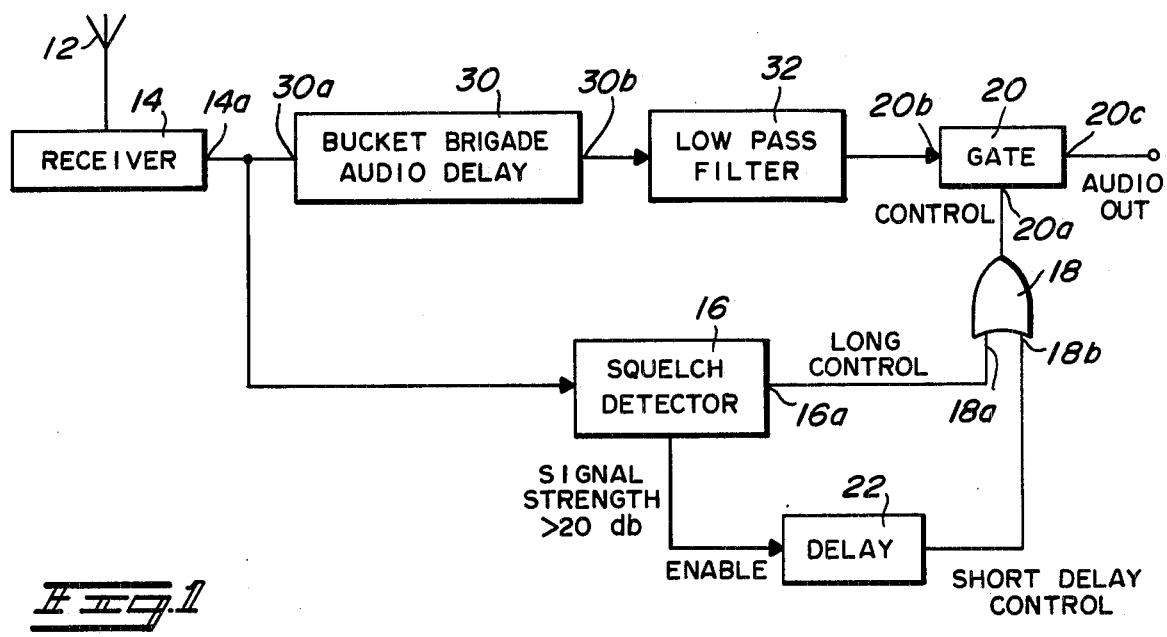
FIG. 1 is a block diagram illustrating the principal elements of the preferred embodiment of the squelch circuit.

The control output from the squelch detector 16 feeds to the first input 18a of an OR gate 18. The OR gate in turn feeds to the control terminal 20a of a transmission gate 20. Gate 20 includes an input terminal 20b and an output terminal 20c. In response to receiving a control signal at its control input 20a, the gate 20 responds by directly coupling its input terminal 20b to its output terminal 20c. Otherwise these first and second gate terminals are uncoupled. Fed to the second input 18d of the OR gate 18 is the output from a delay circuit 22. The delay circuit 22 is, in turn, fed the squelch detected signal from the squelch detector 16. It has been found that under varying signal strength conditions, the squelch circuit according to this embodiment of the invention exhibits a varying squelch detector delay. The delay circuit 22 compensates for varying signal level delay, as is more fully described herein below.

The output 14a from the receiver 14 is also fed to the input 30a of a bucket brigade audio delay device 30. Acting in the conventional manner, the bucket brigade 30 reproduces signals received at its input 30a at its output 30b after delaying them by a predetermined time interval. In the instant embodiment of the invention, the bucket brigade audio delay 30 is designed to delay the input signal by approximately the longest delay exhibited by the squelch detector 16. The output from the bucket brigade audio delay 30 is in turn low pass filtered by filter 32 to remove any high frequency signals thereon, and passed to the input terminal 20b of the gate 20.

Operation of the squelch gate is understood as follows. Signals received at the antenna 12 and demodulated to audio frequency signals by the receiver 14 at its output 14a include information signals preceded and succeeded by noise signals. During noise signals the squelch detector 16 does not activate its output 16a to produce a control signal for closing the gate 20. Thus the audio is muted, or squelched. However, once an input signal contains a noise signal immediately preceding an information signal the squelch circuit 16 produces a control signal at its output 16a, which output control signal is produced a predetermined delay period after reception of an information signal. The control signal is passed through the OR gate 18 to close the gate 20. Since the delay to the input signal provided by the bucket brigade audio delay device 30 has been designed to be approximately equal to the inherent delay in the squelch detector 16, the gate 20 will be activated at the proper time to allow the beginning of the information signal to pass to the gate output 20c. Thus, there is little, if any, loss of the initial portion of the information signal.

The gate remains closed for as long as an information signal is present. Once the input signal makes a transition from an information signal to noise signals the squelch detector removes the control signal from its output 60a after its inherent time delay. Since this time delay is approximately equal to the time delay provided by the bucket brigade audio delay 30, the gate 30 is opened at virtually the precise moment of the conclusion of the information signal. Thus, there is no annoying noise burst passed to the audio output terminal 20c from the squelch gate.

It has been found in one embodiment of the invention that the squelch detector exhibits a 150 millisecond time delay for typical amplitude received signals. Thus the bucket brigade audio delay 30 is designed for a 150 millisecond delay. It was further observed, however, that for received signals having a strength 20db or greater than the aforementioned typical signal, the operation of the squelch detector 16 is much faster in its turn off mode, whereby it does not exhibit a full 150 millisecond time delay. In these conditions the additional delay circuitry 22 is enabled, whereby it produces an output signal which, when applied to the OR gate 18, retains the gate 20 in its closed condition for the full delay of the bucket brigade audio delay, in this instance 150 milliseconds. This assures that the gate is opened only at the precise instance of the conclusion of an information signal.

It should be clear that the delay 22 need only be employed in situations wherein the delay characteristics of the squelch detector 16 vary as a function of signal strength. More than one additional delay circuit 22 might be employed in some situations wherein the characteristic delay is known to vary greatly with input signal level.

Thus, the preferred embodiment as described with respect to FIG. 1 provides a simple, yet precise means for squelching a receiver output. This system may be easily implemented in any future or existing radio design, and does not require a specially encoded signal be generated by the transmitter.

The above described squelch circuit has been utilized successfully in a sectored antenna receiving system, which is the subject of a U.S. patent application entitled "Sectored Antenna Receiving System," invented by Timothy P. Craig and James R. Stimple, assigned to the same assignee as the instant invention, Ser. No. 792,963, filed May 2, 1977, now U.S. Pat. No. 4,101,836.

Figure 2:
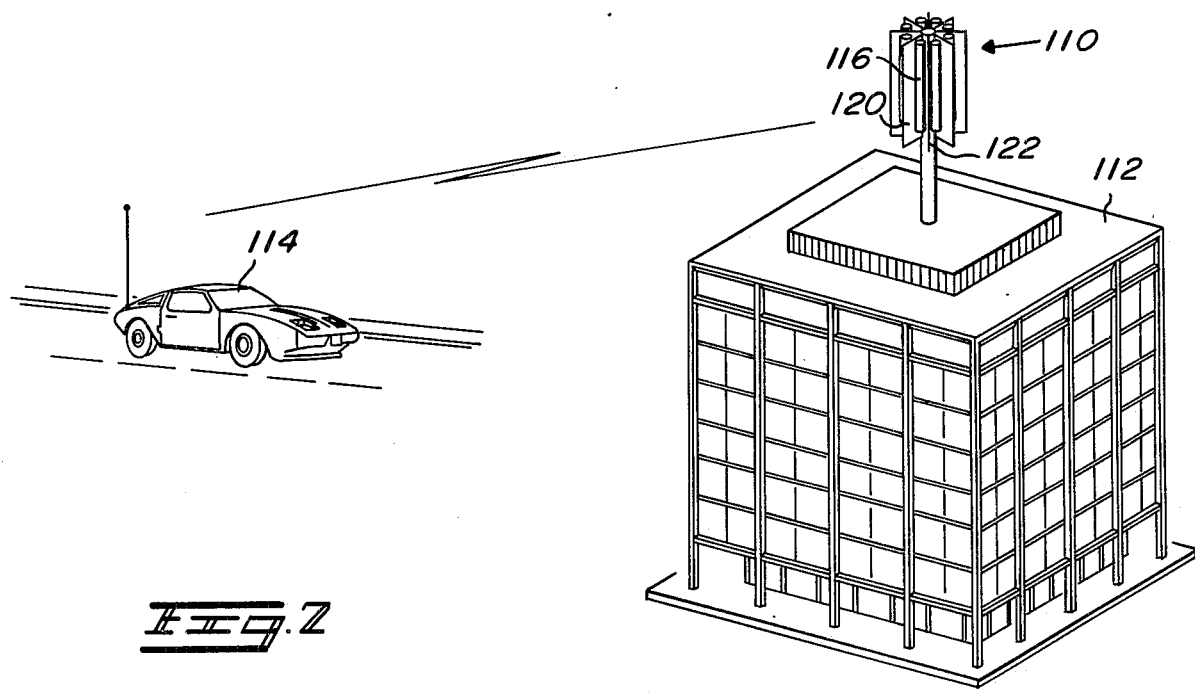
FIG. 2 illustrates a communication system which includes an eight sector hoizontally directive antenna array, mounted atop a building, suitable for communication with a remotely located vehicular transmitter, which system employs a preferred embodiment of the invention.

FIG. 2 generally illustrates a sectored antenna system used in a land mobile communication system Here, a sectored antenna array 110 is shown mounted atop a building 112. Communication from the array is to be established with a remotely located transmitter, which is illustrated as being carried by the vehicle 114.

The array 110 includes eight sectors, one element of which is indicated at 116, which are nestled between 45° angle reflectors, two of which are indicated at 120 and 122. Each sector is horizontally directive and is predeterminedly oriented with respect to the remaining sectors such that all sectors in the array are capable of covering the total horizontal angle of 360°.

Figure 3:
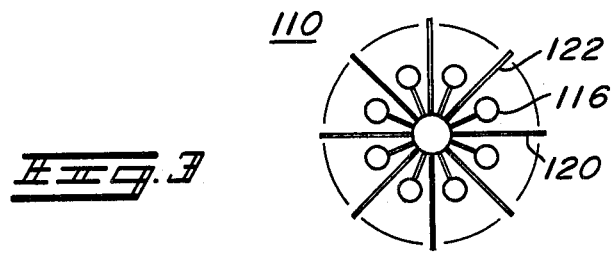
FIG. 3 is a top view of the radiation pattern of the eight sectored antenna array shown in FIG. 2.

FIG. 3 is a top view of the antenna array 110 showing the eight antenna elements, one of which is indicated at 116, and the 45° reflectors, two being shown at 120, 122. As a result of the design of the antenna structure and its corresponding reflectors each antenna sector is capable of receiving transmitted signals which are generated from within a defined horizontal angle. It should be understood that since each sector of the antenna array is directional, the array is capable of superior signal to noise performance over an omnidirectional antenna. The fact that the sectors are horizontally directive further enhances the signal to noise characteristics.

Figure 4:
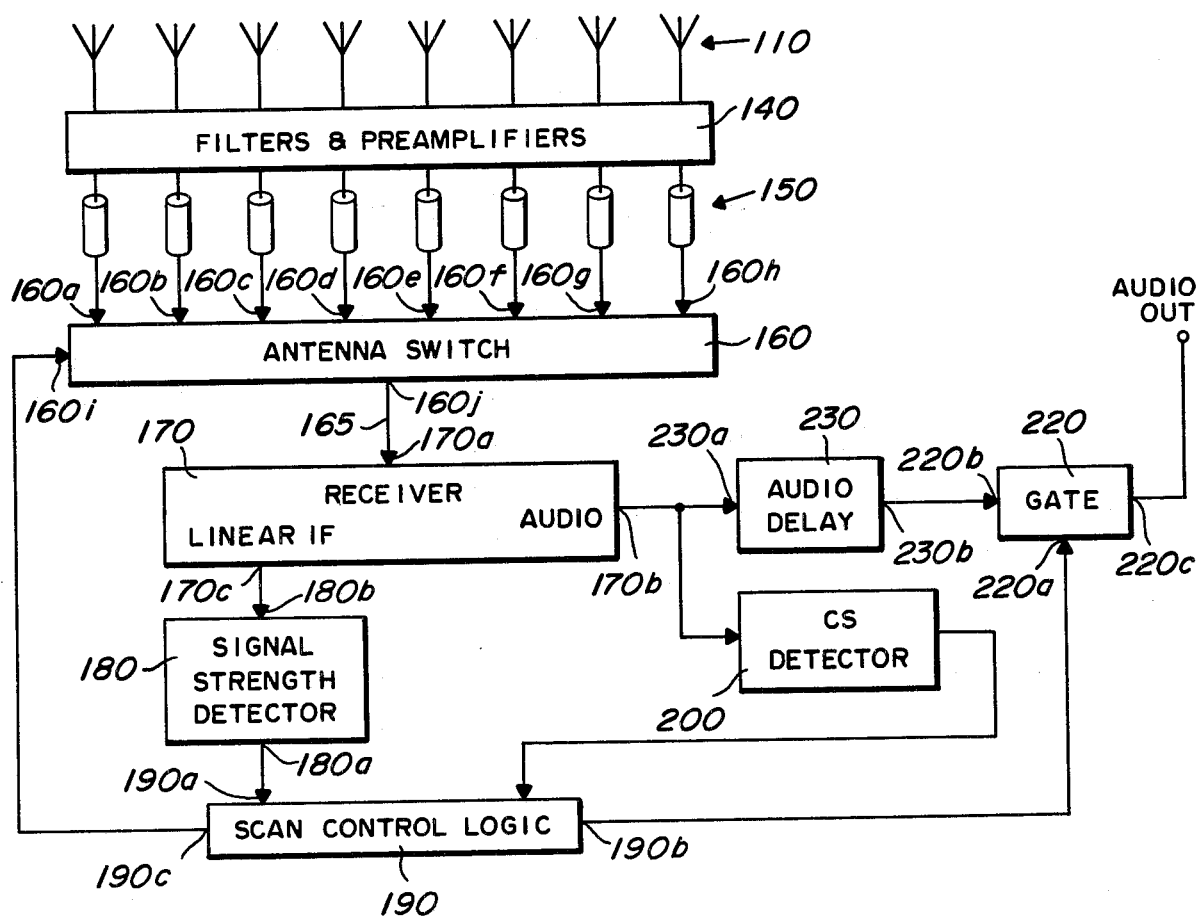
FIG. 4 is a generalized block diagram of the sectored antenna receiving system including the squelch circuit according to the invention.

FIG. 4 is a generalized block diagram which illustrates application of the instant squelch circuit into the sectored antenna receiving system. Here, the array of sectored antenna array elements 110 are mounted, as for example, in FIG. 2, in predetermined orientation on top of a suitable structure. Each antenna sector feeds to a filter and preamplifier circuit 140 which provides gain to the sector received signals at those frequencies of interest. The amplified sectored received signals pass over coax cables 150 to an antenna switch 160. The antenna switch 160 comprises a plurality of input terminals 160a–160h, an output terminal 160i and a control input terminal 160j. In response to control signals received at its control input terminal 160i, the antenna switch 60 couples a selective one of the sectors 130 to the antenna switch output terminal 160i.

The output 160j from the antenna switch 160 is coupled via a suitable conductor 165 to the input 170a of a radio frequency receiver 170. Radio frequency receiver 170 is of conventional design in that it mixes the input radio frequency signals to an intermediate frequency, thereafter filtering the signals via an intermediate frequency stage, detecting the signals and reproducing the signals as audio or data output at its audio output terminal 170b. The output from the intermediate frequency stage is available at a receiver output terminal 170c.

The intermediate frequency output 170c from the receiver is coupled to a signal strength detector 180. The signal strength detector 180 produces a signal at its output 180a which is indicative of the level of signals received at its input 180b. The signal strength signals are in turn passed to the first input 190a of scan control logic circuitry 190. A further input 190b to the scan control logic 190 is the provided output from a coded signal detector 200. The input to the coded signal detector is provided at the audio output 170b of the receiver 170. It is very common in land mobile communication systems to provide a coded signal on transmitted signals, which coded signal normally includes information as to the identity of the transmitting station as well as other pertinent information of use to the system. Commonly, such coded signals are predetermined subaudible or audible tones which may be decoded by the presence of suitable bandpass filters, vibrating reeds, or the like. Thus, the output from the coded signal detector 200 is activated, if the audio signal at the receiver output 170b contains an appropriate coded signal. However, the coded signal detector 200 exhibits a finite time delay between the instance of receiving a coded signal and producing an output detect signal.

The scan control logic circuitry 190 processes its input signals and produces appropriate control signals on its first output 190c which are in turn coupled to the control input terminal 160i of the antenna switch 160.

Detailed operation of the scan control logic 190 is more fully described in the above referenced patent application. Briefly, however, the scan control logic 190 responds to its received input signals to operate the sectored receiving system in one of a number of modes. For the condition wherein none of these sectors receives an input signal above a predetermined level, a control signal from the scan control logic applied to the control input terminal 160j of the antenna switch 160 causes the receiver to be sequentially coupled to each of the antenna sectors. Once a sector receives a signal whose amplitude is such that the output from the signal strength detector is above the given threshold level, the scan control logic operates the system in the second, or continuing scan mode. In this mode each antenna structure is again scanned for a predetermined continuing scan time, with a relative signal strength from each sector being stored in the first sample and hold array within the scan control logic 190. At the end of the continuing sampling period that sector which recorded the largest signal during both scanning intervals is coupled to the receiver. If the system is not operating in the coded signal mode, the receiver remains coupled to that sector until such time as a signal therefrom drops to a predetermined level for a predetermined time period.

If, however, the system is operating in a mode whereby it only responds to input signals which contain a coded signal, at the end of the continuing sampling period the receiver will be coupled to that sector which receives the strongest signal and which contains the coded signal. In this mode, if by the conclusion of the continuing signal mode none of the sectors has received the coded signal, thus indicating that an interferer is present, the scan control logic operates the system in an alternate scan mode wherein a general scan of the sectors is made as in the first mode but the output from each sector is applied to a second sample hold array.

Now, each input from a sector to the second sample hold array is compared with a stored peak value for that sector in the first sample and hold array caused by the interferer. If the signal strength from any sector in the second sample hold array is a predetermined voltage above its stored value in the first sample hold array the scan control logic once again activates the system to the continuing scan mode. As before, in the continuing scan mode all sectors are scanned for a predetermined time interval, with the peak value signal level from each sector being stored now in the second sample hold array. At the end of the continuing scan interval the scan control logic couples the receiver to that sector which exhibits the greatest voltage increase over its previously stored value. As before, the control logic then checks to determine whether or not the signal received by the selected sector contains the proper coded signal. If it does, the receiver continues to be coupled to that sector until the signal from that sector diminishes to a given level for a predetermined time period. If that signal does not contain the coded signal the scan control logic causes the system to revert to the first, or general scan mode.

It is desirable that the audio output from the receiver be squelched except for those times when a sector has been selected and the signal therefrom contains the coded signal. Thus, the scan control logic 190 produces an activated output at its output 190b during such times. The activated output in turn feeds to the control input terminal 220a of a transmission gate 220. Transmission gate 220 is identical to that shown in FIG. 1 and includes an input terminal 220b and an output terminal 220c which comprises the audio output of the entire system. In response to receiving a control signal at its control input 220a, the gate 220 couples its input 220b to its output 220c thereby passing signals therethrough.

Optimum operation of the above described sectored antenna receiving system requires a minimun of overall time delay between the time a transmitter initially begins its transmission and the time that a particular sector is picked and the presence of a coded signal is detected. If this delay is excessive the initial portion of the information signal from the transmitting source may be lost. This overall delay is caused by two primary sources, i.e., the sequencing time of the antenna sectors and the detect time of the coded signal detector 200. To eliminate the apparent delay caused by the coded signal detector 200, the audio delay circuit 230 is incorporated, which, in a manner similar to audio delay 30 of FIG. 1, is coupled from the audio output 170b of the receiver to the input terminal 220b of the gate 220. The audio delay circuitry 230, which may be comprised of a bucket brigade device, couples signals from its input terminals 230a to its output terminal 230b with a predetermined time delay. This delay is chosen to be substantially equivalent to the inherent delay of the coded signal detector 200.

Thus, the squelch system including the audio delay 230 and gate 220 operate in a manner as discussed with respect to the embodiment of FIG. 1 to cause an information signal from the receiver to be passed to the audio output 220c of the gate for precisely the duration of that audio signal. This avoids the possibility of loss of information at the initial portion of a received information signal, which would otherwise occur due to the inherent delay of the coded signal detector 200.

By using the inventive squelch circuit according to the instant invention, the apparent acquisition time of the above described sectored antenna receiving system is substantially enhanced, i.e., loss of information at the initial portion of a transmitted signal can be either greatly minimized or totally eliminated.

While preferred embodiments of the instant invention have been described in detail, it should be apparent that many modifications and variations thereto are possible, all of which fall within the true spirit and scope of the invention.

I claim:

1. A squelch circuit adapted to receive and process an input signal containing an information signal preceded and/or followed immediately by a noise signal, comprising:

detector means for detecting the presence of an information signal and producing a control signal in response thereto, said detector means exhibiting a predetermined first delay between the time of receiving an information signal and the production of said control signal and a predetermined second delay between the conclusion of said information and the cessation of said control signal, said first and second delays being approximately equal;

gating means having an input terminal, an output terminal and a control input terminal, the gating means responding to said control signal at its control input terminal to couple said input terminal to said output terminal;

means for coupling the detector means produced control signal to the control input terminal of said gating means; and delay means for coupling said input signal to said gating means input terminal, the delay means providing a fixed overall delay to said input signal, which delay is approximately equal to said first and second delays of said detector means such that said input signal is passed to the output terminal of the gating means only for the duration of said information signal.

2. The squelch circuit of claim 1 wherein the detector means time delay is dependent on the level of the input signal and wherein the delay provided by the delay means is approximately equal to the longest detector means delay for any input signal level, the squelch circuit further comprising means responsive to the level of the input signal to provide additional time delay between said detector and said gating means control terminal, said additional delay of predetermined magnitude such that the input signal is passed to the output terminal of the gating means only for the duration of said information signal.

3. The squelch circuit of claim 1 wherein the delay means is comprised of a bucket brigade device.

4. A radio frequency communication system comprising: a sectored antenna means having a plurality of sectors, each sector predeterminedly oriented with respect to the remaining sectors;

an antenna switch means having a plurality of input terminals, a control terminal, and an output terminal and further including means responsive to control signals at the control terminal to couple a selected input terminal to the output terminal;

antenna coupling means for coupling each antenna sector to a predetermined input terminal of the antenna switch means;

receiver means adapted for receiving radio frequency signals, said receiver means comprising signal strength detector means for producing a signal representative of the strength of the radio frequency signal being received;

receiver coupling means for coupling the antenna switch means output terminal to the receiver means;

scan control logic means, having an input coupled to the receiver means signal strength detector and an output coupled to the antenna switch means control terminal, and operable in a first mode for producing control signals at its output causing sequential coupling of the sectors to the receiver means for effecting the scanning thereof, the scan control logic means including comparator means for monitoring the signal strength detector produced signal and activating the scan control logic to a second mode in response to said signal being of predetermined magnitude, the scan control logic means operable in its second mode to continue sector scanning for a predetermined interval after which scanning is inhibited and the receiver is coupled to that sector which produces the greatest detected signal strength;

detector means for detecting the presence of a predetermined coded signal on the signal being coupled to the receiver and producing a control signal in response thereto, said detector means having an inherent fixed delay between the time of receiving an information signal and the production of said control signal;

gating means having an input terminal, an output terminal and a control input terminal, the gating means responding to a control signal at its control input terminal to couple said input terminal to said output terminal;

means for coupling the detector means produced control signal to the control input terminal of said gating means;

delay means for coupling said input signal to said gating means input terminal, the delay providing a fixed delay to said input signal, which delay is approximately equal to the delay of said detector means; and utilization means coupled to the output terminal of said gating means for utilizing the signal thereat.

5. The communication system of claim 4 wherein the delay means is comprised of a bucket brigade device.

* * * * *